United States Patent
Bannister et al.

(10) Patent No.: US 10,473,696 B2
(45) Date of Patent: Nov. 12, 2019

(54) WIRELESS ROGOWSKI COIL SYSTEM

(71) Applicant: Fluke Corporation, Everett, WA (US)

(72) Inventors: Matthew Carl-Robert Bannister, Lake Stevens, WA (US); David Lawrence Epperson, Everett, WA (US); Clark N. Huber, Everett, WA (US)

(73) Assignee: Fluke Corporation, Everett, WA (US)

( * ) Notice: Subject to any disclaimer, the term of this patent is extended or adjusted under 35 U.S.C. 154(b) by 173 days.

(21) Appl. No.: 15/470,420

(22) Filed: Mar. 27, 2017

(65) Prior Publication Data

US 2017/0199230 A1    Jul. 13, 2017

Related U.S. Application Data

(62) Division of application No. 14/497,082, filed on Sep. 25, 2014, now Pat. No. 9,606,146.

(51) Int. Cl.
| | |
|---|---|
| *G01R 31/02* | (2006.01) |
| *G01R 15/18* | (2006.01) |
| *G01R 15/12* | (2006.01) |
| *G01R 19/00* | (2006.01) |
| *G01R 31/302* | (2006.01) |

(52) U.S. Cl.
CPC .......... *G01R 15/181* (2013.01); *G01R 15/12* (2013.01); *G01R 15/125* (2013.01); *G01R 19/0092* (2013.01); *G01R 31/3025* (2013.01)

(58) Field of Classification Search
USPC ................................. 324/117 R, 117 H, 127
See application file for complete search history.

(56) References Cited

U.S. PATENT DOCUMENTS

| | | | | |
|---|---|---|---|---|
| 4,855,671 | A | * 8/1989 | Fernandes | G01K 1/024 324/127 |
| 8,330,449 | B2 | 12/2012 | Greenberg | |
| 8,775,109 | B2 | 7/2014 | Curt et al. | |
| 2004/0153215 | A1* | 8/2004 | Kearney | H02H 3/063 700/293 |
| 2005/0083206 | A1 | 4/2005 | Couch et al. | |
| 2007/0007968 | A1 | 1/2007 | Mauney, Jr. et al. | |

(Continued)

FOREIGN PATENT DOCUMENTS

| | | |
|---|---|---|
| CN | 101957394 A | 1/2011 |
| CN | 102625916 A | 8/2012 |

(Continued)

OTHER PUBLICATIONS

Jalebi et al., "Real Time Rotor Bar Current Measurements Using a Rogowski Coil Transmitted Using Wireless Technology," University of Cambridge White Paper, Aug. 9, 2003, 9 pages.

(Continued)

*Primary Examiner* — Vincent Q Nguyen
(74) *Attorney, Agent, or Firm* — Seed Intellectual Property Law Group LLP

(57) ABSTRACT

A Rogowski coil in a sensor unit has voltage induced by a conductor surrounded by the Rogowski coil. The voltage is integrated to represent current which is converted to digital data representing current in the conductor and sent wirelessly to a multimeter. The sensor unit may receive control signals from the multimeter and a remote control apparatus. A plurality of sensor units may be networked and controlled by the remote control apparatus.

15 Claims, 3 Drawing Sheets

(56) References Cited

U.S. PATENT DOCUMENTS

| | | | |
|---|---|---|---|
| 2007/0236208 A1 | 10/2007 | Kojovic et al. | |
| 2008/0077336 A1 | 3/2008 | Fernandes | |
| 2008/0276111 A1* | 11/2008 | Jacoby | G06F 21/55 713/340 |
| 2009/0243590 A1* | 10/2009 | West | G01R 19/04 324/117 R |
| 2009/0251130 A1* | 10/2009 | Lund | G01R 15/125 324/115 |
| 2011/0140694 A1 | 6/2011 | Cima et al. | |
| 2011/0184675 A1 | 7/2011 | White et al. | |
| 2011/0260711 A1* | 10/2011 | Badegruber | B23K 11/257 324/127 |
| 2012/0046799 A1 | 2/2012 | Alex et al. | |
| 2014/0097691 A1 | 4/2014 | Jackson et al. | |

FOREIGN PATENT DOCUMENTS

| | | |
|---|---|---|
| CN | 103197133 A | 7/2013 |
| CN | 103581002 A | 2/2014 |
| EP | 2 275 827 A2 | 1/2011 |
| EP | 2 693 224 A1 | 2/2014 |

OTHER PUBLICATIONS

Bicelli, S. et al., "From the Traditional Multimeter to the 'Wireless Multimeter Networking'", IEEE Instrumentation and Measurement Technology Conference, IMTC, Apr. 24, 2006, 6 pgs.

Office Action for Chinese Application No. 201510621420.6 dated Feb. 26, 2019, 26 pages.

\* cited by examiner

WIRELESS ROGOWSKI COIL SYSTEM

BACKGROUND

Technical Field

Systems and methods for measuring current in a conductor.

Description of the Related Art

Multimeters, also called digital multimeters or "DMMs," are adapted for measuring a number of parameters generally needed for service, troubleshooting, and maintenance applications. Such parameters typically include a.c. (alternating current) voltage and current, d.c. (direct current) voltage and current, and resistance or continuity. Other parameters, such as frequency, capacitance, and temperature, may also be measured to meet the requirements of the particular application. In order to measure current with a general purpose multimeter, an internal current shunt having a known resistance must be inserted in the current path, requiring a break in the current-carrying conductor. The voltage drop across the current shunt is then measured to determine the current flow.

General purpose multimeters employing internal current shunts are generally limited to ten amperes maximum because of the capacity of the multimeter test leads and circuitry to carry the current. Furthermore, the multimeter generally must be protected with an internal fuse to prevent excessive current levels from flowing through the multimeter, both for safety reasons and to prevent damage to the multimeter. The difficulty in removing a blown fuse, coupled with the time and cost necessary to procure a replacement fuse, make it desirable to obtain a non-contact current measuring instrument that requires no internal fuse.

Clamp-on multimeters provide improved capability for measuring current over general purpose multimeters by employing an integral current clamp which senses the current in the current-carrying conductor without having to cut the current-carrying conductor or break the circuit including the current-carrying conductor. A current clamp is typically provided in the same housing with a multimeter which measures other parameters such as voltage and resistance in the conventional manner using separate test probes. The current clamp is closed around the current-carrying conductor, which may include copper wires and buss bars, to sense the magnetic field created by the current flow. The current clamp provides a voltage signal for measurement by the multimeter which calculates and displays the measured current level. Because there is no current shunted from the current-carrying conductor through the clamp-on multimeter, the constraint on the maximum current that may be measured has largely been eliminated. Likewise, the internal fuse has been eliminated in clamp-on multimeters.

In order to obtain a valid current measurement, the magnetic core in the current clamp must completely encircle the current-carrying conductor so that the current clamp is completely closed. The current clamp must be mechanically actuated to open the jaws, the current-carrying conductor inserted, and the jaws then closed around the current-carrying conductor. In tight physical spaces such as an electrical cabinet, inserting the clamp-on multimeter and using this technique to make a current measurement is inconvenient and difficult. Moreover, the jaws must be aligned to complete the magnetic core for obtaining a valid current measurement. Clamp-on multimeters are therefore difficult to use in confined spaces and require a large physical space in which to open the jaws of the current clamp.

Clamp-on multimeters also tend to be physically heavy because of the substantial amount of iron used on the magnetic core. Furthermore, high levels of current may saturate the magnetic core. The current measuring capacity of the clamp-on multimeter is accordingly limited to current levels that do not saturate the magnetic core. The clamp-on multimeters and wired Rogowski coil are both able to sense alternating current flowing through a conductor surrounded by the clamp or Rogowski coil. There are, however, a number of differences between the Rogowski coil and the clamp. For example, a Rogowski coil is more flexible and has a smaller cross-section than the substantially rigid clamp of the multimeter. The Rogowski coil can accordingly be used in confined spaces that are too tight and/or too small for the clamp-type multimeter. Further, the loop of a Rogowski coil can be reshaped to surround conductors having cross-sections that the clamp cannot close around. Another difference is the greater current measuring capability of the Rogowski coil as compared to the clamp. Specifically, an air core does not become saturated at levels of current that saturate the magnetic material of the cores of the clamp.

However, the Rogowski coil is limited by the parasitic resistance, capacitance and inductance of the connecting cable. To minimize parasitic effects, it is desired to keep the length of the connecting cable as short as practical. The length of the connecting cable also limits the distance between the placement of the Rogowski coil and the position of a technician viewing the measurements taken with the coil. The conductor enclosed by the Rogowski coil may be in a room or cabinet with limited room for the person operating the multimeter. The conductor may carry large voltage and currents that represent a danger to the technician because accidental contact with an exposed conductor could be harmful and possibly fatal. Despite the progress made by systems such as those shown and described in U.S. Pat. No. 8,330,449, there remains an unmet need for improved convenience and safety that cannot be provided by a Rogowski coil wired to a multimeter.

BRIEF SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The embodiments described and shown herein are for a wireless remote controlled Rogowski coil, a system that controls the wireless Rogowski coil, and a method for remotely measuring the current in a conductor surrounded by a Rogowski coil. In particular, the wireless remote-controlled Rogowski coil is a sensor unit having an elongated Rogowski coil. A conductor surrounded by the coil induces a voltage in the Rogowski coil. The voltage is integrated by an integrator circuit or device to provide an output signal representative of current in the conductor. The current signal is converted into digital signals by an analog to digital converter. The digital signal representing the current is wirelessly transmitted by a transceiver that sends the digital data and receives control signals. A multimeter or other control apparatus has a wireless transceiver for receiving the digital data from the sensor transceiver and for sending control signals to the transceiver of the Rogowski coil.

The sensor unit may have a memory and a controller. The integrator and analog to digital converter may be distinct devices or circuits or incorporated into the controller.

The control signals are configured to place the sensor transceiver in an idle mode, command the sensor unit to exit the idle mode and take one or more readings of the current in the conductor, or periodically transmit readings of the current in the conductor.

BRIEF DESCRIPTION OF THE SEVERAL VIEWS OF THE DRAWINGS

The foregoing aspects and many of the attendant advantages of this disclosure will become more readily appreciated as the same become better understood by reference to the following detailed description, when taken in conjunction with the accompanying drawings, wherein.

DETAILED DESCRIPTION

Specific details of embodiments according to the present disclosure are described below with reference to electrical circuits including a conductor. Other embodiments of the disclosure can have configurations, components, features or procedures different than those described in this section. A person of ordinary skill in the art, therefore, will accordingly understand that the disclosure may have other embodiments with additional elements, or the disclosure may have other embodiments without several of the elements shown and described below with reference to FIGS. 1-3.

Figure 1:
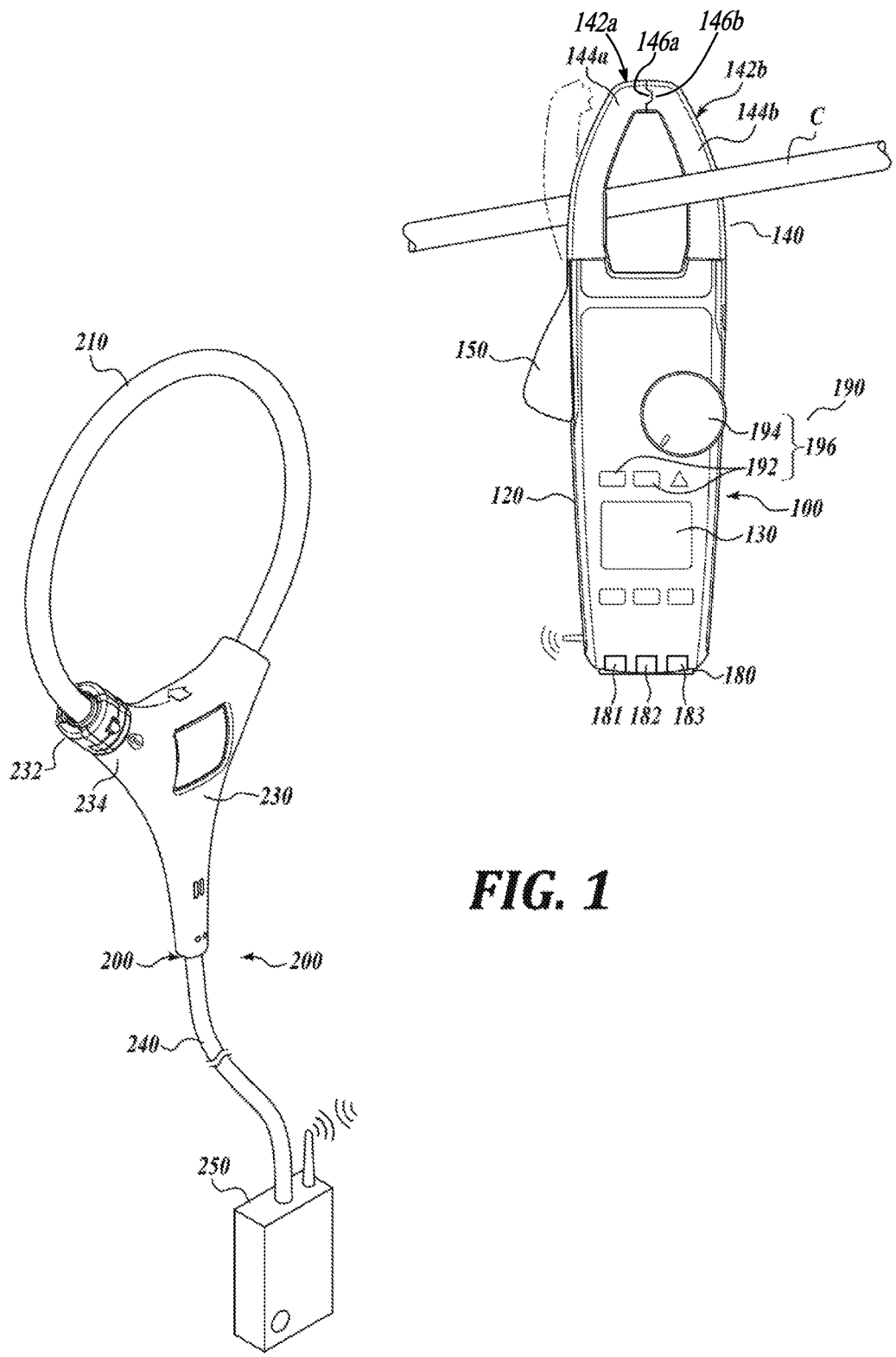
FIG. 1 is a schematic illustration of a multimeter with a wireless Rogowski coil sensor unit according to an embodiment of the present disclosure for measuring alternating current.
Figure 2:
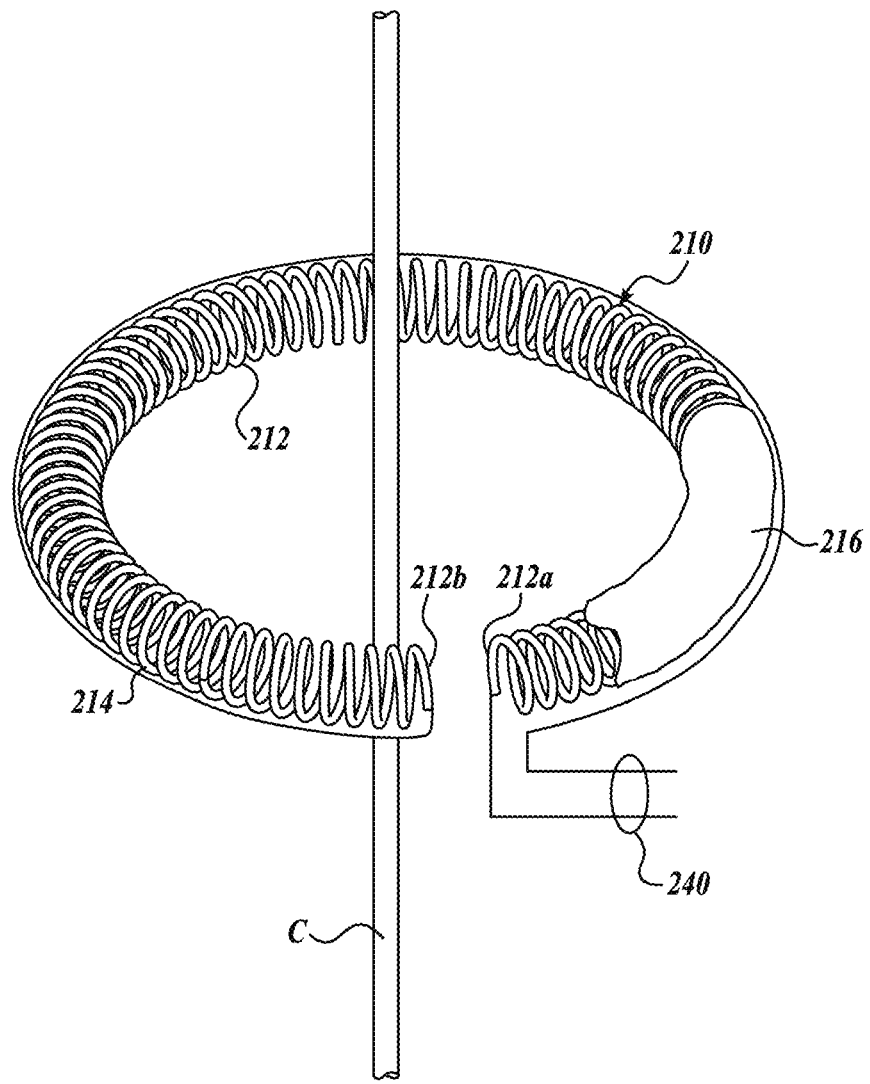
FIG. 2 is a schematic illustration of components of a Rogowski coil according to an embodiment of the present disclosure.

FIG. 1 is a schematic illustration of the multimeter 100 wirelessly coupled to the Rogowski coil sensor 200. The multimeter 100 includes a housing 120 having a slender shape whereby a user (not shown) is able to comfortably hold the housing 120.

A clamp 140 is provided on the housing 120. The clamp 140 includes a pair of clamp portions 142a and 142b having cores 144a and 144b, respectively. The clamp cores 144a and 144b can include windings (not shown) around a core made of a magnetizable material, e.g., iron. The first clamp portion 142a is movably attached, e.g., pivotally attached, to the housing 120 and capable of moving to an arrangement shown with one-dot-chain lines. The second clamp portion 142b can be fixed with respect to the housing 120. The clamp portions 142a and 142b include ends 146a and 146b, respectively, and are accordingly capable of being positioned in an open arrangement with the ends 146a and 146b separated by a gap. The clamp portions 142a and 142b are also capable of being positioned in a closed arrangement with the ends 146a and 146b being contiguously engaged. Thus, the closed arrangement of the clamp 140 shown in solid lines in FIG. 2 has an approximately ring-like shape. A lever 150 fixed to the first clamp portion 142a can be used to move the first clamp portion 142a relative to the second clamp portion 142b and/or the housing 120. The clamp 140 is configured to inductively sense a flow of alternating current in a conductor C surrounded by the clamp 140 in the closed arrangement. The clamp 140 may include a Hall effect current sensor (not shown) for, e.g., sensing a direct current flowing in the conductor C. The clamp 140 can sense the flow of current without breaking an electrical circuit (not shown in FIG. 2) that includes the conductor C. The clamp 140 may produce a first signal in a first voltage range corresponding to the current flow.

The housing 120 includes a port 180 that has one or more terminals 181, 182, 183 for sensing other electrical parameters. Plugs on the ends of lead wires of other sensors (not shown) may be connected to the port 180 to introduce to the multimeter 100 various signals that indicate voltage, resistance and/or temperature.

The housing can include a display 130, for example, a liquid crystal display (LCD). The display 130 shows measured parameters such as alternating current, or alternating current frequencies that are inductively sensed by the clamp 140. In particular, a signal is induced in the clamp 140 by a flow of current in the conductor C that is surrounded by the clamp 140. The display 130 also shows the electrical parameters sensed by signals received via the port 180. If desired, another Rogowski coil with a three prong plug may be inserted into the port 180. Such a wired Rogowski coil is shown and described in U.S. Pat. No. 8,330,449, which is assigned to the assignee of this patent, and whose entire content is hereby incorporated by reference for all purposes.

The housing 120 includes one or more selectors 190, e.g., push-buttons 192 and/or a rotary switch 194. The selectors 190 may turn on and off a power source (not shown) for the multimeter 100 and/or change the measuring modes of the multimeter 100. For example, the rotary switch 194 can be turned to select a mode for measuring alternating current with the clamp 140. Other modes for measuring voltage, resistance, temperature, etc., can be selected with the selectors 190. According to embodiments of the present disclosure, the selectors 190 can also be used to select a mode for measuring alternating current with the Rogowski coil sensor 200.

Figure 3:
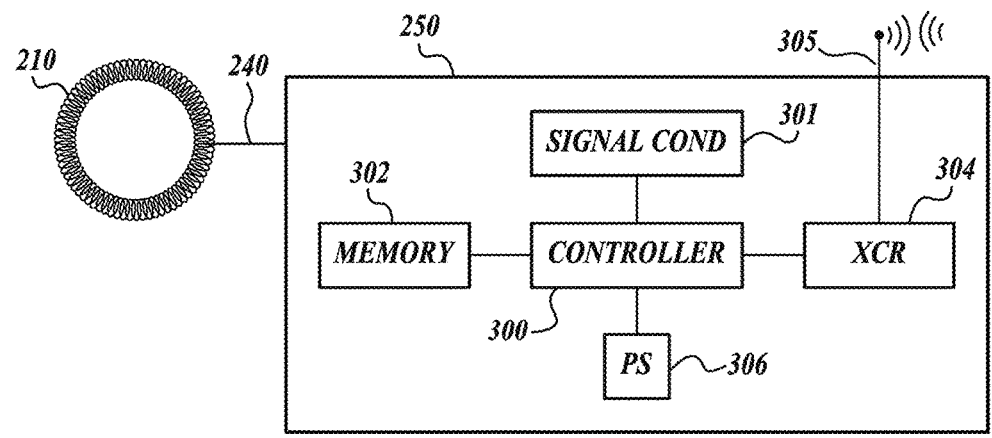
FIG. 3 is a block diagram of components of a multimeter according to an embodiment of the present disclosure.
Figure 3:
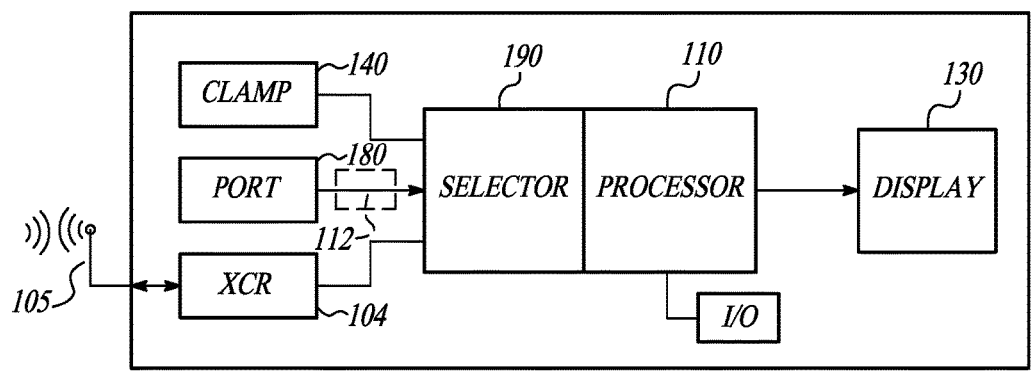
Figure 3:
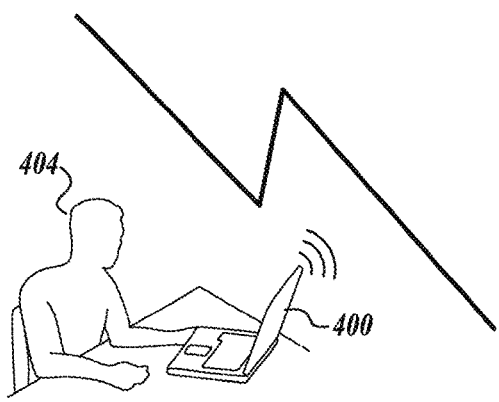

The Rogowski coil sensor 200 includes a loop 210, a pendant 230, a signal cable 240, and a wireless controller 250. Additionally, referring to FIG. 2, the loop 210 includes a toroidal coil 212 having a central wire surrounded by the same wire wound in a helix around a flexible, non-magnetic core 214 and sheathed in a flexible covering 216. As a result, one end of the coil is taken through the coil itself and brought out the other side so that both ends of the coil are on the same side 212a. According to one embodiment of the present disclosure, the non-magnetic core 214 includes air. The covering 216 can be sufficiently rigid to protect the form of the toroidal coil 212 and still be sufficiently flexible to allow the loop 210 to be adjusted in length and/or shape. The length of the loop 210 can be adjusted with the pendant 230. A start turn of the toroidal coil 212a and an end turn of the toroidal coil 212b are electrically connected by the signal cable 240 to the wireless controller 250 (FIG. 3). The end turn 212b has an insulated cap 232 that plugs into an insulated bushing 234 of pendant 230. A technician opens the loop 210 by removing end 212b from the pendant 230, positioning the loop around a conductor, and reclosing the loop by inserting the cap 232 into bushing 234.

The wireless controller 250 sends data signals to the multimeter 100 and receives control signals from the multimeter 100 or other control apparatus. The clamp 140 and the Rogowski coil sensor 200 are both able to sense alternating current flowing through a conductor surrounded by the clamp 140 or the loop 210. There are, however, a number of differences between the Rogowski coil sensor 200 and the clamp 140. For example, the loop 210 is more flexible and has a smaller cross-section than the substantially rigid clamp portions 142a and 142. The Rogowski coil sensor 200 can accordingly be used in confined spaces that are too tight and/or too small for the clamp 140. Further, the loop 210 can be reshaped to surround conductors having cross-sections that the clamp 140 cannot close around. Another difference is the greater current measuring capability of the Rogowski coil sensor 200 as compared to the clamp 140. Specifically, an air core does not become saturated at levels of current that saturate the magnetic material of the cores 144a and 144b. Yet another difference is the Rogowski coil sensor 200 is spaced from the multimeter 100 by the signal cable 240 whereas the relative position of the clamp 140 is fixed with respect to the multimeter 100. Thus, the clamp 140 and the multimeter 100 can be handled as a single unit whereas the Rogowski coil sensor 200 allows the user to position the Rogowski coil sensor unit 200 around a conductor and hold the multimeter 100 a safe location removed from proximity to the conductor.

FIG. 3 is a block diagram of components of a system including the multimeter 100 and the Rogowski coil sensor unit 200 according to an embodiment of the present disclosure. The multimeter 100 includes the display 130, the clamp 140, and the port 180, a wireless transceiver 104, the selectors 190 and a processor 110. The wireless transceiver 105 communicates with the Rogowski coil sensor unit 200 by sending control signals and receiving data signals from the Rogowski coil sensor unit 200. The control signals may include commands to the sensor unit 200 to power up from an idle or sleeping mode, power down to an idle or sleeping mode, provide current readings of voltage sensed by the loop 210, or provide periodic readings of the voltage sensed by the loop 210. The clamp 140 includes a winding that inductively senses alternating current without breaking the electrical circuit and produces a first signal in a first voltage range corresponding to the alternating current. For example, the first voltage range may be measured in terms of millivolts. The first signal is received by the processor 110 which outputs a signal to the display 130. Similarly, other signals from the port 180 are also received by the processor 110. According to certain embodiments, the selector 190 selects the signal(s) that the processor 110 uses to present the desired measurements on the display 130.

The Rogowski coil sensor unit 200 inductively senses alternating current without breaking the electrical circuit and produces a second signal in a second voltage range corresponding to the alternating current. For example, the second voltage range may be measured in terms of microvolts. The Rogowski coil sensor 200 has a wireless control unit 250 that sends data wirelessly to multimeter 100 and receives one or more commands from the multimeter 100 or other control apparatus. The wireless control unit 250 has a controller 300, a signal conditioning circuit 301, a memory 302, a transceiver 304, an antenna 305, and a power supply 306. The controller 300 may be a microprocessor, a digital signal processor, an application-specific circuit or a programmable logic controller. The signal conditioning circuit may comprise one or more circuits for a filter, an integrator, an analog-to-digital converter, or any other circuit for configuring the signal from the Rogowski coil loop 210 to be acceptable for processing by controller 300 and for storage in memory 302. In other embodiments, the one or more conditioning circuits are incorporated directly into the controller 300. In still further embodiments, there is at least an analog-to-digital circuit to convert the voltage signal from the loop 210 into digital data signals that are sent to multimeter 100 or stored until demanded by the multimeter 100.

The memory 302 may be a separate memory, may be directly incorporated into circuitry for the controller 300, or may be both a separate memory and a second memory in the controller 300. The memory 302 may store system and application programs for interpreting and responding to commands received by the transceiver 304. The transceiver 304 is any suitable radio transmitter and receiver. In some embodiments the transceiver complies with original Bluetooth standards. Other embodiments comply with Bluetooth Low Energy standards. Still other embodiments comply with Wi-Fi standards. Alternative embodiments comply with any other suitable radio frequency standards. A power supply 306 provides power directly or indirectly to the controller 300, signal conditioning circuitry 301, memory 302, transceiver 304 and antenna 305. The power supply may comprise batteries including, and not limited to, rechargeable batteries.

In other embodiments a remote control apparatus 400 is operated by an attendant 404 to receive information from one or more Rogowski coil sensor units 200 and multimeters 100 as well as send control signals to one or more Rogowski coil sensor units 200 and multimeters 100. The remote control apparatus may communicate with the Rogowski coil sensor units via one or more networks including, and not limited to, a local wireless network in range of the transceivers 304.

The embodiments described above overcome one or more of the drawbacks and solve one or more of the problems that arise when Rogowski coils are wire-coupled to multimeters. The wireless units 100, 200 provide virtually unlimited flexibility for allowing a technician to safely place a Rogowski coil sensor unit 200 on a target conductor and move safely away from the conductor before manipulating the multimeter 100 to take readings of the conductor. The connecting cable 240 may be very short and may be integral with the bottom of the pendant 230, thereby reducing the potential adverse influence of parasitic factors such as the resistance, capacitance and inductance of the connecting cable 240. In other embodiments the wire 240 is enclosed in a relatively short rigid insulated conduit.

Some embodiments of the disclosure have wireless sensor units that include an integrator circuit coupled to the Rogowski coil, an analog to digital converter coupled to the output of the integrator and a wireless transmitter coupled to the output of the analog to digital converter. The wireless transmitter continuously transmits the output of the analog to digital converter. Existing multimeters, such as those shown in U.S. Pat. No. 8,330,449, could be modified to have a receiver or transceiver wire-connected via port 180 so that the current data could be received and displayed on multimeter 100. Accordingly, the disclosure is not limited to the particular placement of any one type of circuitry in the sensor unit 200 of the multimeter 100.

In some embodiments the multimeter 100 may also receive a wired Rogowski coil in port 180. Such multimeters also include an integrator 112 to scale the second signal from the wired Rogowski coil to the first voltage range, e.g., to scale a microvolt output of the Rogowski coil up to a millivolt signal that the processor 110 can process. The housing 120 of the multimeter 100 includes the processor 110, the integrator 112, the display 130, the clamp 140, the port 180, and the selectors 190.

In other embodiments of the disclosure, other master or control apparatus may be substituted for the multimeter 100.

For example, other digital multimeters with a wireless transceiver but without a clamp 140 may be substituted for the multimeter 100. Still other embodiments may use other apparatus to control the sensor unit including and not limited to tablets, smartphones, personal digital assistants (PDA) and personal computers (PC) equipped with a transceiver may receive signals from the sensor unit 200 and send control signals to the sensor unit. Such DMMs, tablets, smartphones, PDAs and PCs may have condition circuitry and/or software to receive unprocessed signals representative of processed current from sensor units 100 or the sensor units 100 may have conditioning circuitry and/or software to transmit processed signals representative of measured current.

Specific details of the embodiments of the present disclosure are set forth in the description and in the figures to provide a thorough understanding of these embodiments. A person skilled in the art, however, will understand that the invention may be practiced without several of these details, or that additional details can be added to the invention. Well-known structures and functions have not been shown or described in detail to avoid unnecessarily obscuring the description of the embodiments of the present disclosure.

Unless the context clearly requires otherwise, throughout the description and the claims, the words "comprise," "comprising," and the like are to be construed in an inclusive sense, as opposed to an exclusive or exhaustive sense; that is to say, in the sense of including, but not limited to. Additionally, the words "herein," "above," "below," and words of similar connotation, when used in the present disclosure, shall refer to the present disclosure as a whole and not to any particular portions of the present disclosure. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

While illustrative embodiments have been illustrated and described, it will be appreciated that various changes can be made therein without departing from the spirit and scope of the invention.

The embodiments of the invention in which an exclusive property or privilege is claimed are defined as follows:

1. A method for measuring current in a conductor, the method comprising:
   producing a first signal representative of current flow in a first electrical conductor, wherein the first signal is produced by a multimeter having a wireless transceiver, the multimeter being positioned with respect to the first electrical conductor to produce the first signal representative of current flow in the first electrical conductor;
   wirelessly transmitting information corresponding to the first signal from the wireless transceiver of the multimeter;
   producing a second signal representative of current flow in a second electrical conductor, wherein the second signal is produced by a Rogowski coil sensor unit separate from the multimeter, and wherein the Rogowski coil sensor unit includes a Rogowski coil positioned around the second electrical conductor; and
   wirelessly transmitting information corresponding to the second signal from a wireless control unit operatively coupled to the Rogowski coil sensor unit,
   wherein the information corresponding to the second signal is transmitted from the wireless control unit to the wireless transceiver of the multimeter and to a remote control apparatus that is separate from the multimeter and the Rogowski coil sensor unit, and
   wherein the remote control apparatus is operable to directly communicate with the multimeter and the Rogowski coil sensor unit via wireless communication to receive the information corresponding to the first signal produced by the multimeter and the second signal produced by the Rogowski coil sensor unit and to send control signals to the multimeter and to the Rogowski coil sensor unit.

2. The method of claim 1, further comprising integrating an electrical signal induced in the Rogowski coil to produce the second signal representative of the current flow in the second electrical conductor.

3. The method of claim 1, wherein the multimeter further has a pair of clamp portions, the method further comprising positioning the clamp portions around the first electrical conductor.

4. The method of claim 1, further comprising operating the Rogowski coil sensor unit in an idle mode in response to a control signal received from the remote control apparatus.

5. The method of claim 1, wherein the information corresponding to the second signal is transmitted by the wireless control unit in response to a control signal received from the remote control apparatus.

6. The method of claim 1, wherein the information corresponding to the second signal is automatically periodically transmitted from the wireless control unit.

7. The method of claim 1, wherein the wireless control unit is coupled to the Rogowski coil sensor unit by a connecting cable and receives the second signal representative of current flow in the second electrical conductor.

8. A system for measuring current in a conductor, the system comprising:
   a multimeter positionable with respect to a first electrical conductor to produce a first signal representative of current flow in the first electrical conductor, wherein the multimeter includes a wireless transceiver that is operable to wirelessly transmit information corresponding to the first signal;
   a Rogowski coil sensor unit separate from the multimeter, wherein the Rogowski coil sensor unit includes a Rogowski coil that is positionable around a second electrical conductor to produce a second signal representative of current flow in the second electrical conductor, and a wireless control unit that is operatively coupled to the Rogowski coil sensor unit to wirelessly transmit information corresponding to the second signal; and
   a remote control apparatus that is separate from the multimeter and the Rogowski coil sensor unit, wherein the wireless control unit of the Rogowski coil sensor unit is adapted to wirelessly transmit the information corresponding to the second signal to the wireless transceiver of the multimeter and to the remote control apparatus, and wherein the remote control apparatus is operable to directly communicate with the multimeter and the Rogowski coil sensor unit via wireless communication to receive the information corresponding to the first signal produced by the multimeter and the second signal produced by the Rogowski coil sensor unit and to send control signals to the multimeter and to the Rogowski coil sensor unit.

9. The system of claim 8, wherein the Rogowski coil sensor unit further includes an integrator that integrates an electrical signal induced in the Rogowski coil to produce the second signal representative of the current flow in the second electrical conductor.

10. The system of claim 8, wherein the multimeter further includes a pair of clamp portions that are positionable around the first electrical conductor.

11. The system of claim 8, wherein the Rogowski coil sensor unit is operable in an idle mode in response to a control signal received from the remote control apparatus.

12. The system of claim 8, wherein the wireless control unit is adapted to transmit the information corresponding to the second signal in response to a control signal received from the remote control apparatus.

13. The system of claim 8, wherein the wireless control unit is adapted to automatically periodically transmit the information corresponding to the second signal.

14. The system of claim 8, wherein the wireless control unit is coupled to the Rogowski coil sensor unit by a connecting cable and, in operation, receives the second signal representative of current flow in the second electrical conductor.

15. The system of claim 8, further comprising a plurality of Rogowski coil sensor units separate from the multimeter and the remote control apparatus, wherein the Rogowski coil sensor units are each positionable around an electrical conductor to produce a signal representative of current flow in the respective electrical conductor, and wherein the Rogowski coil sensor units are each operatively coupled to a wireless control unit adapted to wirelessly transmit information corresponding to the produced signal representative of current flow in the respective electrical conductor.

* * * * *